(12) United States Patent
Oda et al.

(10) Patent No.: US 12,713,614 B2
(45) Date of Patent: Aug. 18, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Minoru Oda, Yokkaichi Mie (JP); Taichi Iwasaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 603 days.

(21) Appl. No.: 18/179,865

(22) Filed: Mar. 7, 2023

(65) Prior Publication Data

US 2023/0345729 A1 Oct. 26, 2023

(30) Foreign Application Priority Data

Apr. 20, 2022 (JP) ................................ 2022-069153

(51) Int. Cl.
*H10B 43/35* (2023.01)
*H10B 41/27* (2023.01)
*H10B 41/35* (2023.01)
*H10B 43/27* (2023.01)

(52) U.S. Cl.
CPC ............. *H10B 43/35* (2023.02); *H10B 41/27* (2023.02); *H10B 41/35* (2023.02); *H10B 43/27* (2023.02)

(58) Field of Classification Search
CPC ........ H10B 43/35; H10B 41/35; H10B 41/27; H10B 43/27
See application file for complete search history.

(56) References Cited

U.S. PATENT DOCUMENTS

2020/0020579 A1* 1/2020 Kato .................... H10D 12/038
2020/0083249 A1* 3/2020 Matsuura .......... H01L 23/53209
2020/0091064 A1 3/2020 Iwasaki

OTHER PUBLICATIONS

Xueli Ma et al., "Remote scavenging technology using Ti/TiN capping layer interposed in a metal/high-k gate stack", ECS Transactions, 50 (4), The Electrochemical Society, 2012, pp. 285-290, DOI: 10.1149/05004.0285ecst.

Hao Yu et al., "MIS or MS? Source/Drain Contact Scheme Evaluation for 7nm Si CMOS Technology And Beyond", 2016, 16th International Workshop on Junction Technology (IWJT), Shangai, China, May 9-10, 2016, DOI: 10.1109/IWJT.2016.7486665.

Hao Yu et al., "Thermal Stability Concern of Metal-Insulator-Semiconductor Contact: A Case Study of Ti/TiO2/n-Si Contact", IEEE Transactions on Electron Devices, vol. 63, No. 7, Jul. 2016, pp. 2671-2676, DOI: 10.1109/TED.2016.2565565.

K. Maex et al., "Stability of As and B doped Si with respect to overlaying CoSi2 and TiSi2 thin films", Journal of Materials Research, vol. 4, Issue 5, Oct. 1989, pp. 1209-1217, DOI: https://doi.org/10.1557/JMR.1989.1209.

* cited by examiner

*Primary Examiner* — Richard A Booth
(74) *Attorney, Agent, or Firm* — Kim & Stewart LLP

(57) ABSTRACT

According to one embodiment, a semiconductor device includes a semiconductor substrate having a first surface. The semiconductor substrate has therein a first region. The first region is at the first surface and contains a dopant of a first conductivity type. A first contact contacts the first region at the first surface. The first contact has a first metal layer that contacts the first region, a second metal layer covering the first metal layer, and a third metal layer covering the second metal layer.

20 Claims, 5 Drawing Sheets

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-069153, filed Apr. 20, 2022, the entire contents of which are incorporated herein by reference.

FIELD

Embodiments described herein relate generally to a semiconductor device and a method for manufacturing a semiconductor device.

BACKGROUND

In a semiconductor device, a contact having a stacked structure can be provided for making electrical connection to a semiconductor region provided in a semiconductor substrate. As sizes in semiconductor devices become finer and devices have higher performance, such a contact is required to have enhanced properties.

DETAILED DESCRIPTION

Figure 1:
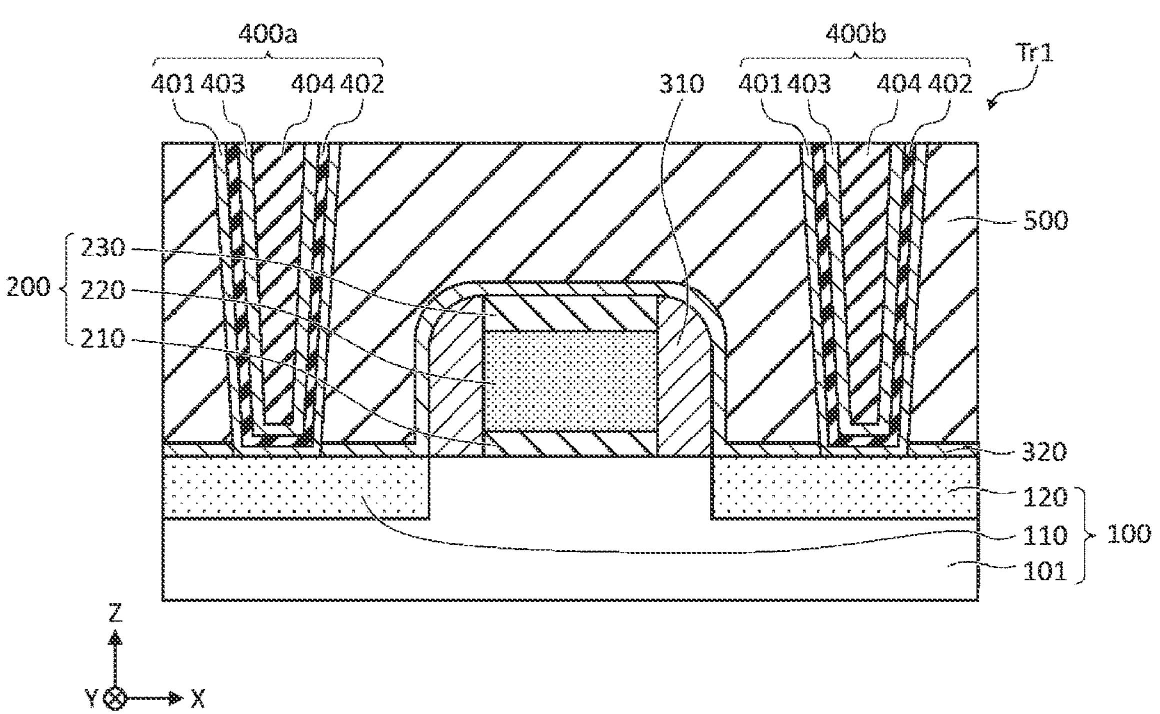
FIG. 1 is a cross-sectional view of a semiconductor device according to an embodiment.

Embodiments provide a semiconductor device having a contact which is highly heat resistant and has a low electrical resistance.

In general, according to one embodiment, a semiconductor device includes a semiconductor substrate having a first surface and a first region in the semiconductor substrate. The first region is at the first surface and contains a dopant of a first conductivity type. A first contact contacts the first region at the first surface. The first contact has a first metal layer that contacts the first region, a second metal layer covering the first metal layer, and a third metal layer covering the second metal layer.

Embodiments of the present disclosure will now be described with reference to the drawings. In the drawings and the description below, the same reference symbols are used for the same or substantially similar components or elements. The drawings are schematic; thus, any depicted relationships between thicknesses and in-plane dimensions, etc. are not necessarily to scale.

The direction in which a gate insulating film and a gate electrode are stacked on a semiconductor portion is herein referred to as a Z direction. A direction perpendicular to the Z direction is referred to as an X direction, and a direction perpendicular to the Z direction and the X direction is referred to as a Y direction.

As used herein, terms such as "above", "upper", "below", "lower", etc. refer to relative positions or directions with respect to other elements or components in the drawings or the like. For example, a direction from the semiconductor portion toward the gate electrode along the Z direction is referred to as "upward", while a direction from the gate electrode toward the semiconductor portion along the Z direction is referred to as "downward". The upper surface or lower surface of a structure refers to the upward-facing surface or downward-facing surface intersecting the Z direction. The upper end or lower end of a structure refers to the upper Z-direction end or lower Z-direction end. A surface intersecting the second direction is referred to as a side surface.

At the outset, the configuration of a semiconductor device according to an embodiment will be described with reference to FIG. 1. For the purpose of illustration, only parts of the configuration particularly relevant to the description of the embodiment are depicted in FIG. 1.

As shown in FIG. 1, the semiconductor device according to this embodiment includes a transistor Tr1. The following description illustrates a case where the transistor Tr1 is a P-channel field-effect transistor. The transistor Tr1 includes a semiconductor portion 100 and an electrode portion 200, which are arranged in the Z direction. The semiconductor device also includes a sidewall insulating film 310 provided on the X-direction side surface of the electrode portion 200, a liner film 320 covering the semiconductor portion 100 and the electrode portion 200, contacts 400*a* and 400*b* connected to the semiconductor portion 100, and an interlayer insulating film 500.

The semiconductor portion 100 includes a semiconductor substrate 101, a first diffusion region 110, and a second diffusion region 120. The semiconductor substrate 101 has a first surface and a second surface opposite to the first surface. The first diffusion region 110 and the second diffusion region 120 are provided on the first-surface side of the semiconductor portion 100. The first diffusion region 110 and the second diffusion region 120 are provided on opposite sides of the electrode portion 200 in the X direction. The first diffusion region 110 is connected to the contact 400*a*, and the second diffusion region 120 is connected to the contact 400*b*.

The semiconductor substrate 101 is a semiconductor material having an N-type well region and a P-type well region. The semiconductor substrate 101, for example, comprises silicon (Si) containing impurities (dopants). The transistor Tr1 shown in FIG. 1 is located in a portion of the semiconductor substrate 101 where an N-type well region is provided. The N-type well region comprises, for example, silicon (Si) with an N-type impurity such as phosphorus (P). A region between the first diffusion region 110 and the second diffusion region 120 in the semiconductor substrate 101 serves as a channel region and is an N-type semiconductor material. An extension region, a halo region, or the like may be provided between the first diffusion region 110 and the second diffusion region 120 in the semiconductor substrate 101.

The first diffusion region 110 functions as a source region. The first diffusion region 110 comprises silicon (Si) containing a P-type impurity such as boron (B), and functions as a P-type semiconductor material.

The second diffusion region 120 functions as a drain region. The second diffusion region 120 comprises silicon (Si) containing a P-type impurity such as boron (B), and functions as a P-type semiconductor material.

The electrode portion 200 is provided on an area lying between the first diffusion region 110 and the second diffusion region 120. Thus, the electrode portion 200 is located between the first diffusion region 110 and the second diffusion region 120. The electrode portion 200 includes a gate insulating film 210, a gate electrode 220, and a cap insulating film 230, which are stacked in this order on the upper surface of the semiconductor substrate 101. The gate insulating film 210 comprises, for example, silicon oxide ($SiO_2$). The gate electrode 220 may be made of a metal or polysilicon (poly-Si) implanted with an impurity such as boron (B) or phosphorus (P). Alternatively, the gate electrode 220 may be a stacked film including a metal film and a polysilicon film. The cap insulating film 230 comprises, for example, silicon nitride (SiN).

The sidewall insulating film 310 is, for example, a silicon nitride (SiN) film, a silicon oxide ($SiO_2$) film, or a stacked film including these films or the like. The liner film 320 comprises, for example, silicon nitride (SiN).

The contacts 400*a* and 400*b* are conductive contacts made of, for example, a metal, and extend in the Z direction. The contact 400*a* is used as a source contact. The contact 400*b* is used as a drain contact. The contacts 400*a* and 400*b* each have a stacked structure comprising a first metal layer 401, a second metal layer 402, a third metal layer 403 and a fourth metal layer 404.

The first metal layer 401 comprises, for example, titanium nitride (TiN). The first metal layer 401 in the contact 400*a* is in contact with the first diffusion region 110, while the first metal layer 401 in the contact 400*b* is in contact with the second diffusion region 120.

The second metal layer 402 is a metallic film comprising a metal having high electron affinity, such as titanium (Ti), hafnium (Hf) or aluminum (Al). Additional metals or components may be present in the second metal layer 402. The lower surface of the second metal layer 402 in the contact 400*a* is in contact with the upper surface of the first metal layer 401, which is in contact with the first diffusion region 110. The lower surface of the second metal layer 402 in the contact 400*b* is in contact with the upper surface of the first metal layer 401, which is in contact with the second diffusion region 120.

The third metal layer 403 comprises titanium nitride (TiN) or the like. The fourth metal layer 404 comprises tungsten (W) or the like. The lower surface of the third metal layer 403 is in contact with the upper surface of the second metal layer 402.

The interlayer insulating film 500 comprises, for example, silicon oxide ($SiO_2$).

The first metal layer 401 and the third metal layer 403 can be considered to be barrier metal layers which have barrier properties that prevent or limit diffusion of a metal material and interactions between metal materials.

The metal in second metal layer 402 can combine in a reducing reaction with oxygen (O) in a natural oxide film which may form on the surface of the semiconductor substrate 101 during the formation of the first metal layer 401. Accordingly, the second metal layer 402 eventually becomes a layer that has taken oxygen therein. Such a reaction can be called a "scavenging reaction". The scavenging reaction that occurs in the second metal layer 402 can prevent the formation of an oxide film at the interface between the semiconductor substrate 101 and the first metal layer 401.

A method for manufacturing the semiconductor device according to this embodiment will now be described. FIGS. 2 through 7 are cross-sectional views illustrating process steps and the like in the semiconductor device manufacturing method. In particular, FIGS. 2 through 7 illustrate, in the same general cross-section as depicted in FIG. 1, process steps for forming the transistor Tr1 and the contacts 400*a*, 400*b*.

Figure 2:
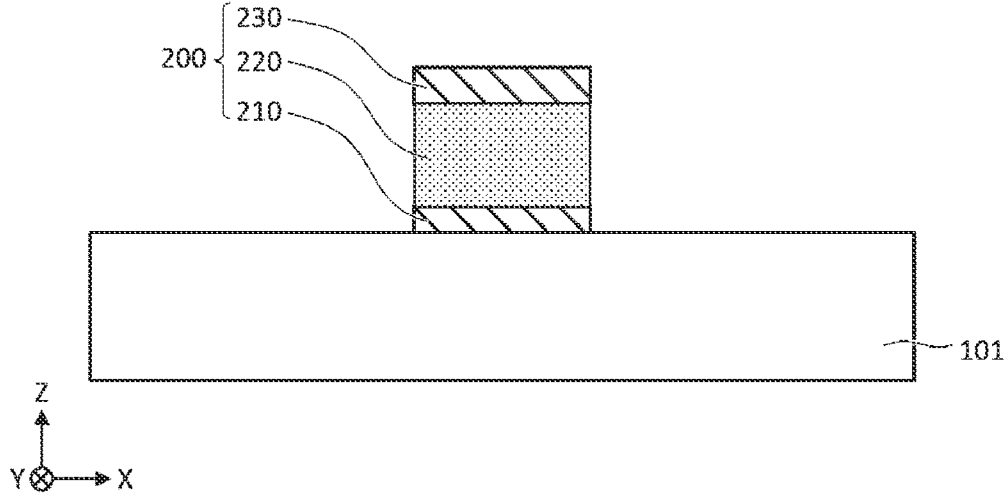
FIGS. 2 to 7 are cross-sectional views illustrating aspects of a method for manufacturing a semiconductor device according to an embodiment

First, as shown in FIG. 2, a gate insulating film 210, a gate electrode 220, and a cap insulating film 230 are formed sequentially on a semiconductor substrate 101, which has been implanted with an N-type impurity such as phosphorus (P).

Figure 3:
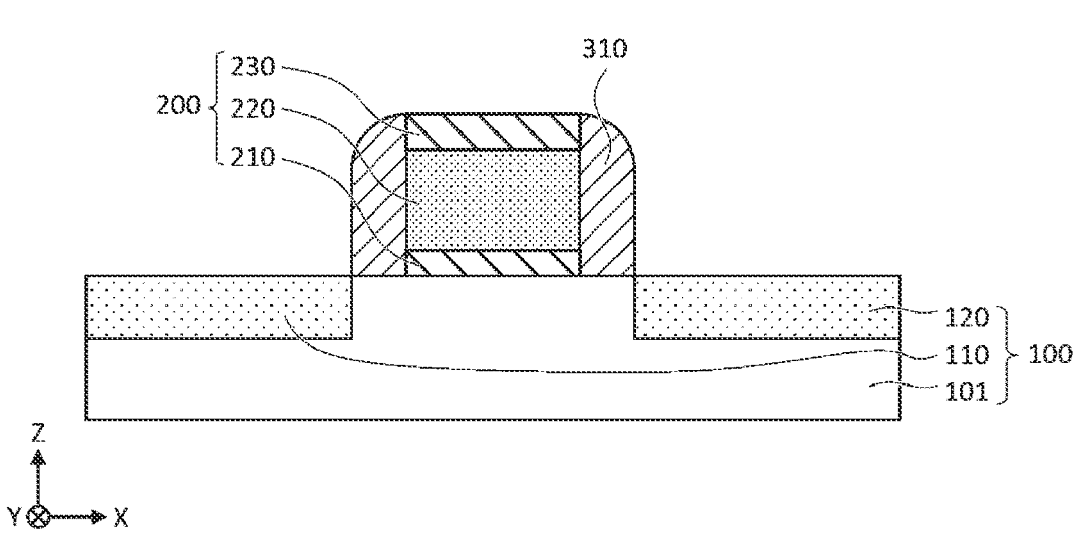

Next, as shown in FIG. 3, a sidewall insulating film 310 is formed, and a P-type impurity such as boron (B) is implanted into the surface of the semiconductor substrate 101, thereby forming a first diffusion region 110 and a second diffusion region 120.

Figure 4:
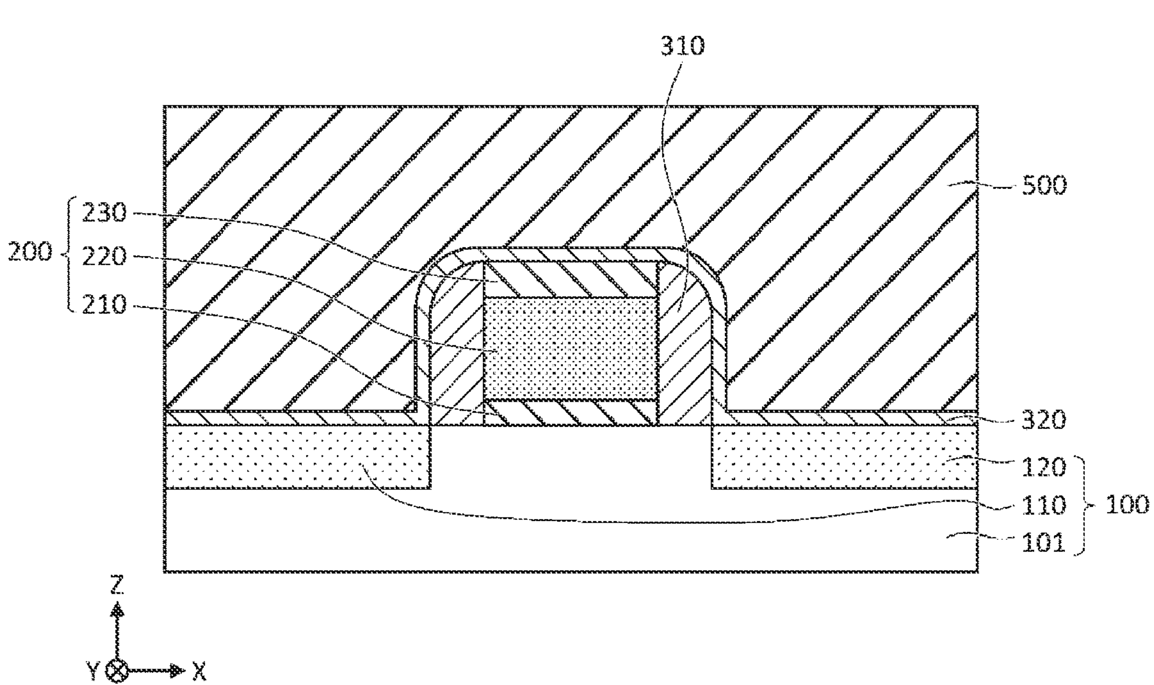

Next, as shown in FIG. 4, a liner film 320 and an interlayer insulating film 500 are formed sequentially.

Figure 5:
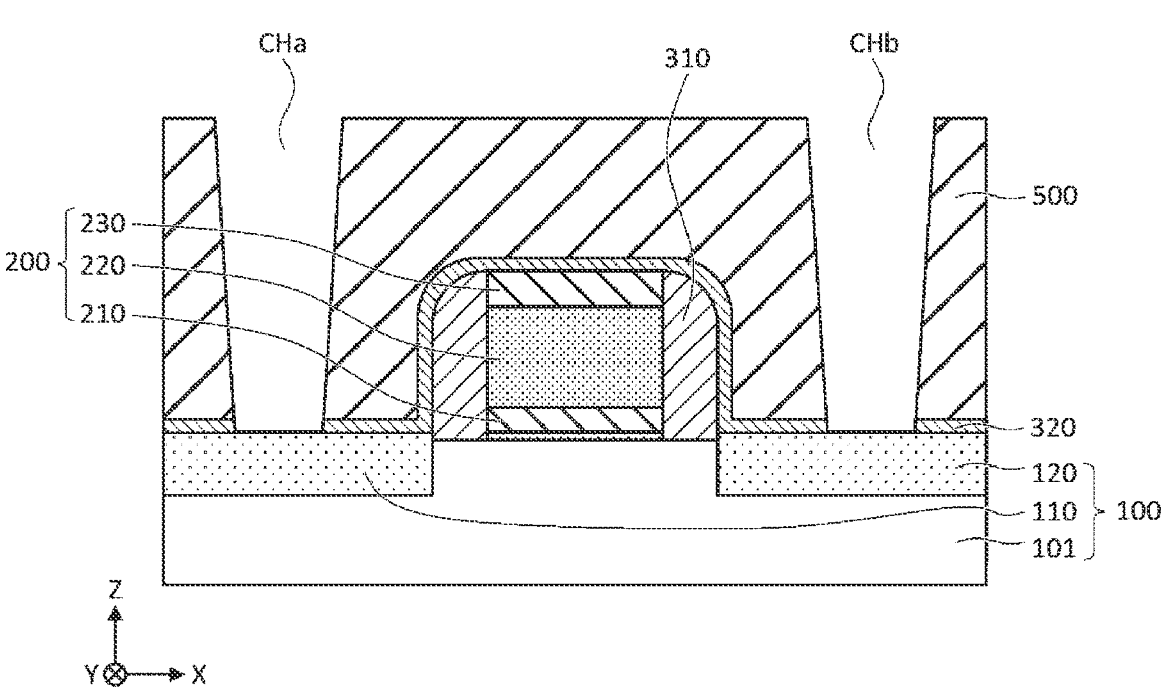
Figure 6:
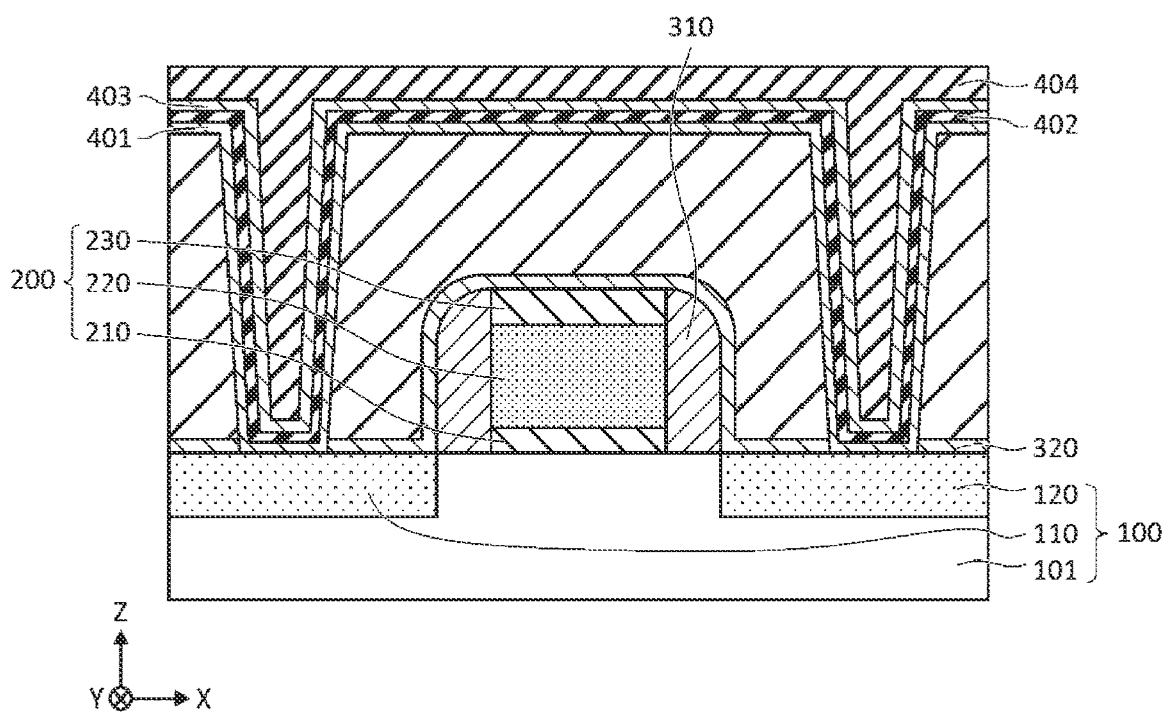

Next, as shown in FIG. 5, contact holes CHa and CHb are formed. The following method may be used to form the contact holes CHa and CHb. First, a resist pattern having openings therein provided at positions where the contacts 300*a* and 300*b* are to be formed, is formed on upper surface of the interlayer insulating film 500. Next, using the resist pattern as a mask, anisotropic etching is performed until the upper surfaces of the first diffusion region 110 and the second diffusion region 120 are exposed in the contact holes CHa and CHb. A thin natural oxide film (not specifically depicted) forms on the upper surface of the semiconductor portion 100 now exposed in the contact holes CHa and CHb. Next, as shown in FIG. 6, a first metal layer 401, a second metal layer 402, a third metal layer 403 and a fourth metal layer 404 are formed sequentially on the interlayer insulating film 500 and on the bottom and sidewall surfaces of the contact holes CHa and CHb. The first metal layer 401 is formed by, for example, an ALD (Atomic Layer Deposition) process or a CVD (Chemical Vapor Deposition) process. The second metal layer 402 is formed by, for example, a PLD (Physical Layer Deposition) process or a CVD process. The third metal layer 403 is formed by, for example, an ALD process or a CVD process. The fourth metal layer 404 is formed by, for example, a CVD process. The second metal layer 402 comprises a metal having high electron affinity, such as titanium (Ti), hafnium (Hf), or aluminum (Al). Through a reducing reaction of such metal in the second metal layer 402 with oxygen in the natural oxide film at the surface of the semiconductor portion 100, oxygen is taken into the second metal layer 402. As noted, this process can be referred to as a scavenging reaction. As a result of this scavenging reaction, the natural oxide film is thinned or perhaps removed.

Figure 7:
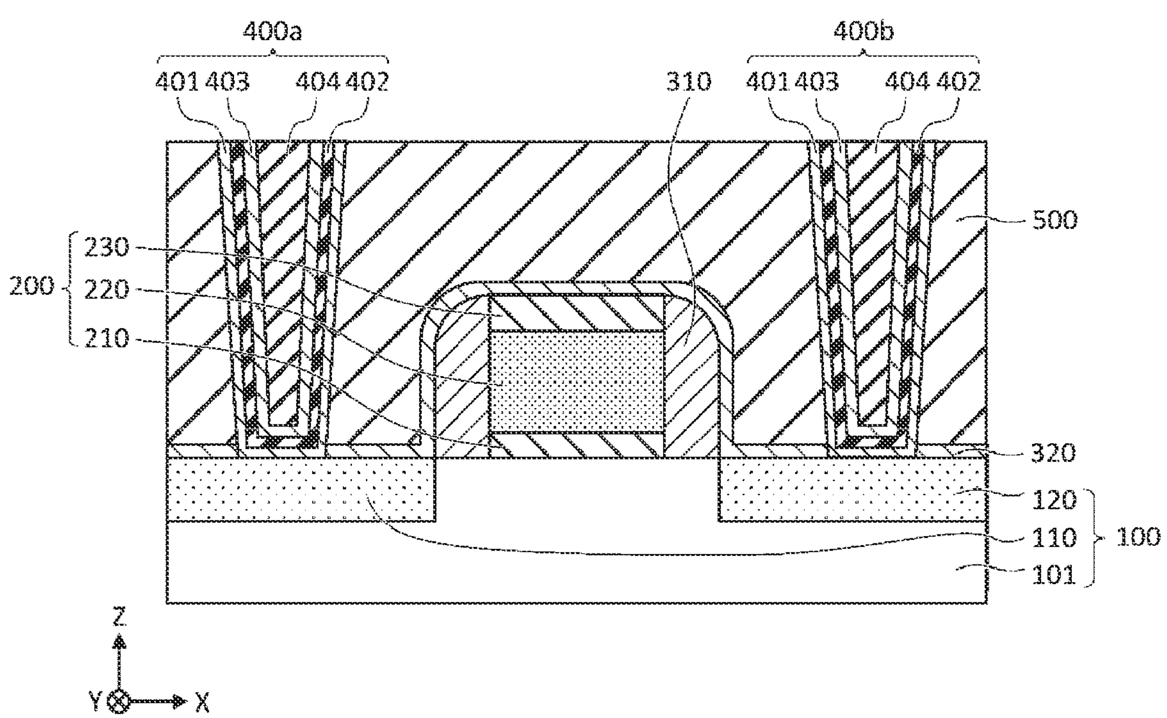

Next, as shown in FIG. 7, the upper portions of the fourth metal layer 404, the third metal layer 403, the second metal layer 402, and the first metal layer 401 are removed by a CMP (Chemical Mechanical Polishing) process or the like to expose the upper surface of the interlayer insulating film 500.

The semiconductor device according to this embodiment can be manufactured in the above-described manner.

Figure 8:
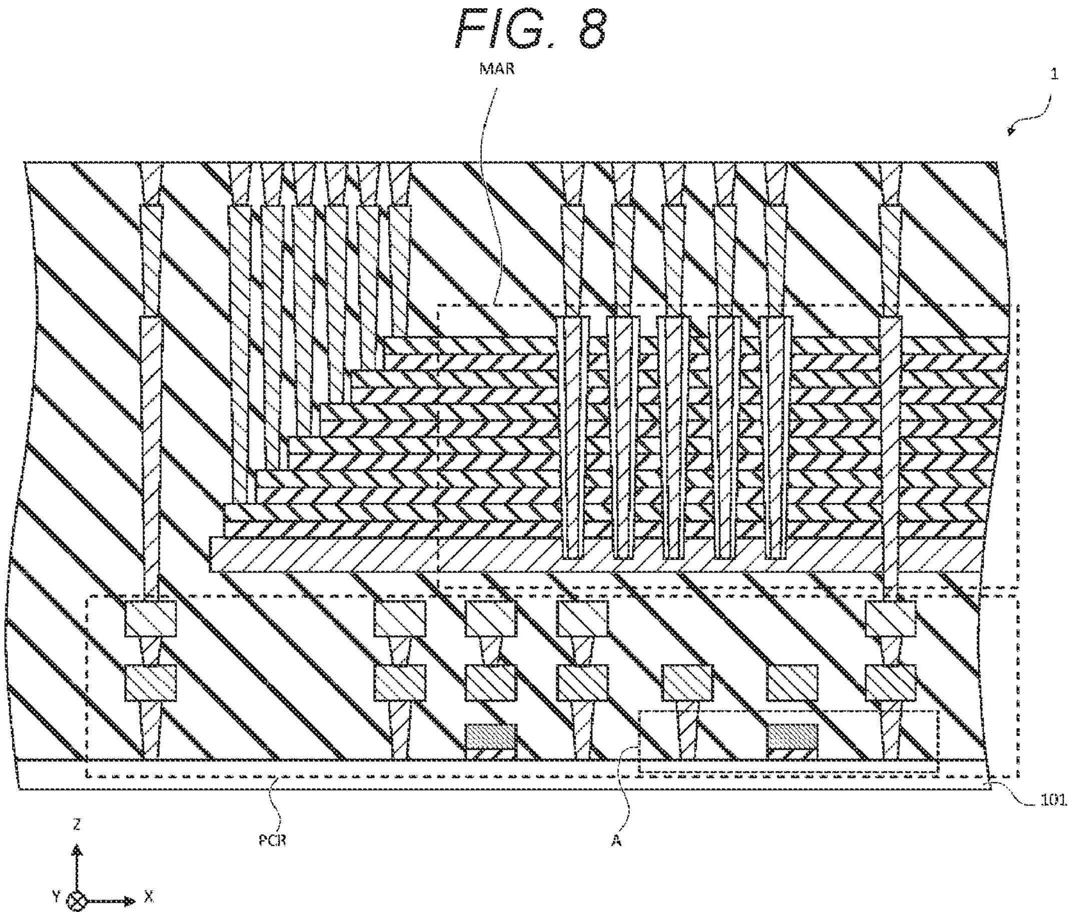
FIG. 8 is a cross-sectional view s of a semiconductor device having a "CMOS under array" structure.

The semiconductor device according to this embodiment may have a CUA (CMOS Under Array) structure as shown in FIG. 8. The CUA structure is a structure in which a peripheral circuit region PCR is provided below a memory cell array region MAR.

The memory cell array region MAR functions as memory cells for storing data and has, for example, a structure in which semiconductor layers and charge storage layers are provided in the Z direction as memory pillars or the like within a stacked body of conductive layers (word lines) stacked alternatingly with insulating layers. The transistor Tr1 is provided, for example, in the region A of FIG. 8. Thus, the transistor Tr1 is provided below the memory cell array region MAR.

Figure 9:
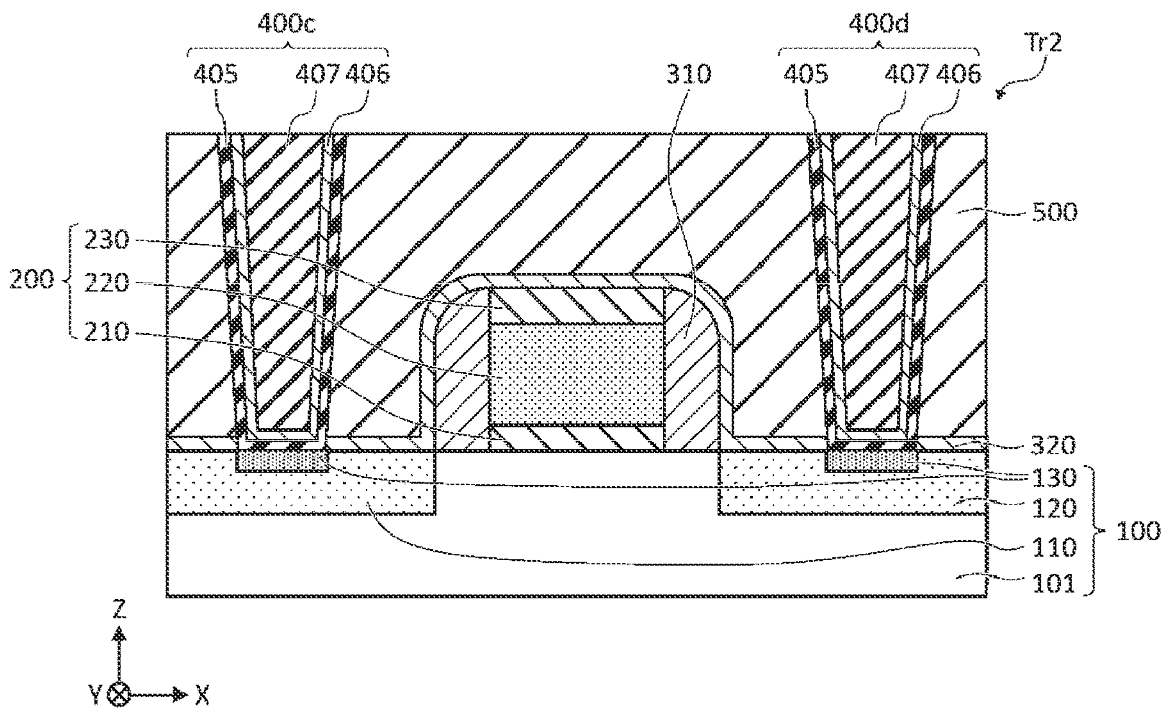
FIG. 9 is a cross-sectional view of a semiconductor device according to a first comparative example.

Certain advantages of a semiconductor device according to this embodiment will now be described by reference to comparative examples. FIG. 9 is a diagram showing the configuration of a semiconductor device according to a first comparative example. As shown in FIG. 9, the transistor Tr2 of the first comparative example includes contacts 400_c_ and 400_d_ connected to the semiconductor portion 100.

The contacts 400_c_ and 400_d_ each have a stacked structure comprising a first metal layer 405, a second metal layer 406 and a third metal layer 407. The first metal layer 405 is a metallic film of, for example, titanium (Ti). The first metal layer 405 reacts with the first diffusion region 110 and the second diffusion region 120 to form a silicide 130. The second metal layer 406 is a barrier metal layer comprising, for example, titanium nitride (TiN). The third metal layer 407 comprises, for example, tungsten (W).

In the first comparative example, the first metal layer 405 in contact with the semiconductor portion 100 is a metallic film of titanium (Ti) or the like. This is because titanium (Ti) can react with the first diffusion region 110 and the second diffusion region 120 to form the silicide 130. The silicide 130 is formed in order to prevent a high electrical resistance at the interfaces between the semiconductor portion 100 and the contacts 400_c_, 400_d_. However, high-temperature treatments used in certain steps of the formation of the memory cell array region MAR may cause abnormal growth of the silicide 130, resulting in a contact failure.

On the other hand, in the semiconductor device according to this embodiment, the first metal layer 401 is a barrier metal layer. Therefore, the formation of a silicide 130 between the semiconductor portion 100 and the contacts 400_a_, 400_b_ is avoided. In the semiconductor device according to the embodiment, the formation of a silicide may be completely prevented; that is, no silicide is present at the interface between the contacts 400_a_, 400_b_ and the semiconductor portion 100. Therefore, a contact failure that might result due to problems with the silicide 130 or the like related to a high-temperature treatment in the formation of memory cell array region MAR can be prevented. Thus, in effect, the heat resistance (tolerance) of the area around the semiconductor portion 100 and the contacts 400_a_, 400_b_ is improved.

In particular, when the structure of the first comparative example is used for the region A of the CUA structure shown in FIG. 8, the memory cell array region MAR is formed after the peripheral circuit region PCR in a CUA structure manufacturing process, and likewise the contacts which are to connect the peripheral circuit region PCR and the memory cell array region MAR are formed before the memory cell array region MAR.

On the other hand, in the case of a CNA (CMOS Next to Array) structure in which a peripheral circuit region PCR is provided outside the memory cell array region MAR (that is, not directly underneath the memory cell array region MAR), contacts can be formed after both the peripheral circuit region PCR and the memory cell array region MAR are formed. Thus, the order of the formation of contacts for connecting the peripheral circuit region PCR and the memory cell array region MAR and the formation of the memory cell array region MAR is opposite in a CNA structure manufacturing process and a CUA structure manufacturing process.

In the CUA structure manufacturing process, a thermal load will be applied to the contacts used for connecting the peripheral circuit region PCR and the memory cell array region MAR. The process may involve a high-temperature treatment at 850° C. or higher during the manufacturing of the memory cell array region MAR. Therefore, the prevention (avoidance) of abnormal growth of a contact silicide such as in a semiconductor device according to this embodiment will be more marked for a CUA structure as compared to a CNA structure.

Figure 10:
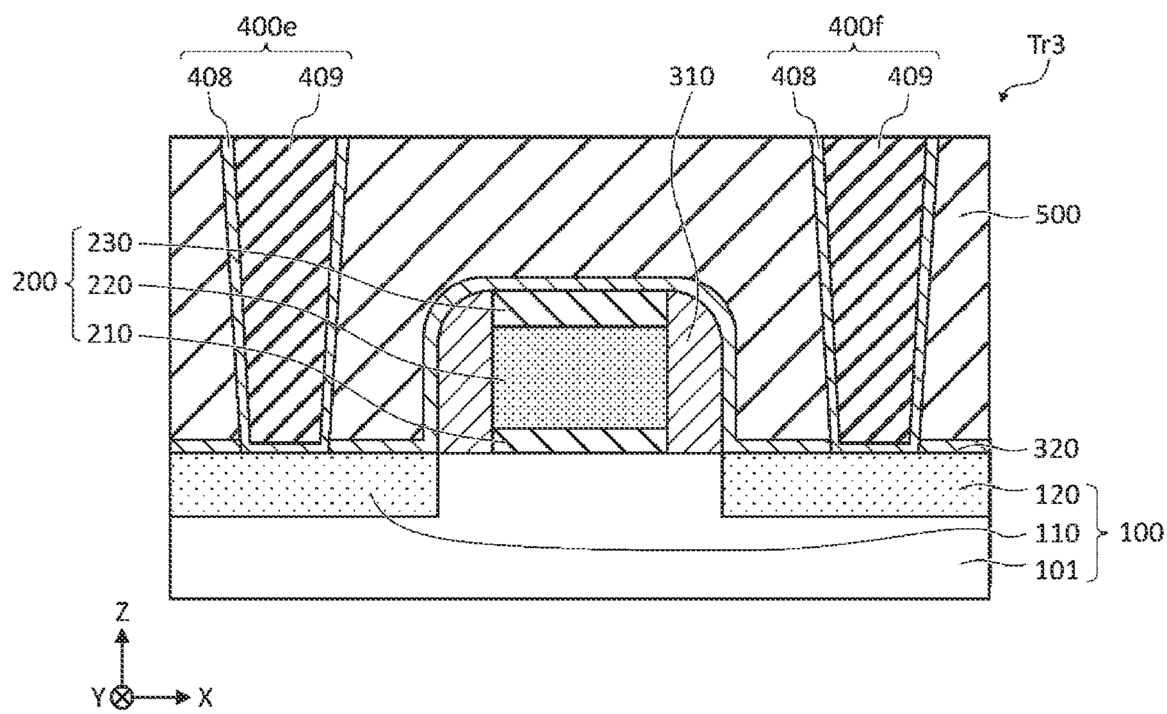
FIG. 10 is a cross-sectional view of a semiconductor device according to a second comparative example.

FIG. 10 is a diagram showing the configuration of a semiconductor device according to a second comparative example. As shown in FIG. 10, the transistor Tr3 of the second comparative example includes contacts 400_e_ and 400_f_ connected to the semiconductor portion 100.

The contacts 400_e_ and 400_f_ each comprise a first metal layer 408 and a second metal layer 409. The first metal layer 408 is, for example, a barrier metal layer comprising titanium nitride (TiN) or the like. The second metal layer 409 comprises tungsten (W) or the like.

In the second comparative example, the first metal layer 408, which is in contact with the semiconductor portion 100, is a barrier metal layer. Therefore, similar to the first comparative example, the heat resistance of the area around the semiconductor portion 100 and the contacts 400_e_, 400_f_ is enhanced. However, it is known that in the structure in which the barrier metal layer and the semiconductor portion 100 are in contact with each other, the interfaces between the semiconductor portion 100 and the contacts 400_c_, 400_d_ have a high electrical resistance. This is because a thin natural oxide film is formed on the upper surface of the semiconductor portion 100 after the formation of the contact holes CHa and CHb.

On the other hand, in the semiconductor device according to the embodiment, the contacts 400_a_ and 400_b_ each have a stacked structure in which the second metal layer 402 is provided between the first metal layer 401 and the third metal layer 403. The first metal layer 401 and the third metal layer 403 are barrier metal layers. The second metal layer 402 comprises a metal having high electron affinity, such as titanium (Ti), hafnium (Hf), or aluminum (Al) and such metal reacts with oxygen in the natural oxide film formed at the surface of the semiconductor portion 100, whereby the oxygen is taken into the second metal layer 402. The natural oxide film can therefore be thinned or removed. In the semiconductor device according to this embodiment, the natural oxide film may even be completely eliminated, leaving no natural oxide film. Therefore, the configuration according to this embodiment can reduce the resistance between the semiconductor portion 100 and the contacts 400_a_, 400_b_ as compared to the configuration of the second comparative example.

In the semiconductor device according to this embodiment, the scavenging reaction of the second metal layer 402 occurs not only with the semiconductor portion 100 but also with the interlayer insulating film 500. Because of the scavenging reaction that occurs with the interlayer insulating film 500 (which is typically made of silicon oxide), the interlayer insulating film 500 in the vicinity of the contacts 400_a_ and 400_b_ becomes deoxygenated, resulting in a reduction in dielectric constant and a reduction in the parasitic capacitance. This makes it possible to increase the operating speed of semiconductor elements formed on the semiconductor substrate 101.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:

a semiconductor substrate having a first surface;

a first region in the semiconductor substrate, the first region being at the first surface and containing a dopant of a first conductivity type; and a first contact contacting the first region at the first surface, the first contact comprising:

a first metal layer that contacts the first region, a second metal layer covering the first metal layer, a third metal layer covering the second metal layer, and a fourth metal layer on the third metal layer, wherein the second metal layer is between the first and fourth metal layer in a direction orthogonal to the first surface.

2. The semiconductor device according to claim 1, further comprising:

an insulating material surrounding the first contact in a plane parallel to the first surface, wherein the first metal layer, second metal layer, and third metal layer are on a sidewall of the first contact with the first metal layer contacting the insulating material, and the second metal layer is between the first and fourth metal layer in a direction parallel to the first surface.

3. The semiconductor device according to claim 2, wherein the fourth metal layer fills an interior of the first contact adjacent to the sidewall.

4. The semiconductor device according to claim 3, wherein the first metal layer is titanium nitride, the second metal layer is a metallic film of titanium, hafnium, or aluminum, the third metal layer is titanium nitride, and the fourth metal layer is tungsten metal.

5. The semiconductor device according to claim 1, further comprising:

a second region in the semiconductor substrate at the first surface, the second region being spaced from the first region and containing a dopant of the first conductivity type; and an electrode on the first surface at a position between the first region and the second region.

6. The semiconductor device according to claim 5, further comprising:

a second contact contacting the second region at the first surface, the second contact comprising:

a fifth metal layer that contacts the second region, a sixth metal layer covering the fifth metal layer, and a seventh metal covering the sixth metal layer.

7. The semiconductor device according to claim 6, wherein the sixth metal layer comprises at least one metal selected from titanium, hafnium, and aluminum.

8. The semiconductor device according to claim 7, wherein the fifth metal layer and the seventh metal layer each comprise titanium nitride.

9. The semiconductor device according to claim 1, wherein the second metal layer comprises at least one metal selected from titanium, hafnium, and aluminum.

10. The semiconductor device according to claim 9, wherein the first metal layer and the third metal layer each comprise titanium nitride.

11. The semiconductor device according to claim 1, further comprising:

a memory cell array region, wherein the first contact is between the memory cell array region and the semiconductor substrate.

12. A semiconductor device, comprising:

a semiconductor substrate having a first surface;

a first region in semiconductor substrate at the first surface and containing dopant of a first conductivity type;

an interlayer insulating film above the first surface in a first direction; and a contact extending through the interlayer insulating film in the first direction and electrically contacting the first region, wherein a bottom of the contact adjacent to the first surface in the first direction and a sidewall of the contact adjacent to the interlayer insulating film in a second direction parallel to the first surface have a stacked layer structure comprising:

a first barrier metal layer that contacts the first region and the interlayer insulating film, a first metallic layer covering the first metal layer, and a second barrier metal layer covering the first metallic layer, and an interior of the contact is filled with a second metallic layer.

13. The semiconductor device according to claim 12, wherein the first metallic layer comprises at least one metal selected from titanium, hafnium, and aluminum.

14. The semiconductor device according to claim 13, wherein the first barrier metal layer and the second barrier metal layer each comprise titanium nitride.

15. The semiconductor device according to claim 14, wherein the second metallic layer is tungsten.

16. The semiconductor device according to claim 12, wherein the first metallic layer is hafnium.

17. A semiconductor device, comprising:

a semiconductor substrate having a first surface;

a first region in the semiconductor substrate, the first region being at the first surface and containing a dopant of a first conductivity type; and a first contact contacting the first region at the first surface, the first contact comprising:

a first metal layer that contacts the first region, a second metal layer covering the first metal layer, a third metal layer covering the second metal layer, wherein the second metal layer comprises at least one metal selected from titanium, hafnium, and aluminum, and the first metal layer and the third metal layer each comprise titanium nitride.

18. The semiconductor device according to claim 17, further comprising:

a memory cell array region, wherein the first contact is between the memory cell array region and the semiconductor substrate.

19. The semiconductor device according to claim 18, further comprising:

a second region in semiconductor substrate at the first surface, the second region being spaced from the first region and containing a dopant of the first conductivity type;

an electrode on the first surface at a position between the first region and the second region; and a second contact contacting the second region at the first surface, the second contact comprising:

a fourth metal layer that contacts the second region, a fifth metal layer covering the fourth metal layer, and a sixth metal covering the fifth metal layer, wherein the fifth metal layer comprises at least one metal selected from titanium, hafnium, and aluminum, and the fourth metal layer and the sixth metal layer each comprise titanium nitride.

20. The semiconductor device according to claim 17, wherein the first contact further comprises:

a fourth metal layer on the third metal layer, wherein the fourth metal layer is tungsten metal.

* * * * *